(12) United States Patent
Luo et al.

(10) Patent No.: US 12,127,400 B2
(45) Date of Patent: Oct. 22, 2024

(54) MICROELECTRONIC DEVICES INCLUDING CORROSION CONTAINMENT FEATURES, AND RELATED ELECTRONIC SYSTEMS AND METHODS

(71) Applicant: Micron Technology, Inc., Boise, ID (US)

(72) Inventors: Shuangqiang Luo, Boise, ID (US); Indra V. Chary, Boise, ID (US)

(*) Notice: Subject to any disclaimer, the term of this patent is extended or adjusted under 35 U.S.C. 154(b) by 237 days.

(21) Appl. No.: 17/648,708

(22) Filed: Jan. 24, 2022

(65) Prior Publication Data

US 2022/0149064 A1 May 12, 2022

Related U.S. Application Data

(63) Continuation of application No. 16/743,342, filed on Jan. 15, 2020, now Pat. No. 11,257,834.

(51) Int. Cl.
*H10B 43/27* (2023.01)
*H01L 21/768* (2006.01)
*H01L 23/532* (2006.01)
*H10B 41/27* (2023.01)

(52) U.S. Cl.
CPC ........... *H10B 41/27* (2023.02); *H01L 21/768* (2013.01); *H01L 23/53271* (2013.01); *H10B 43/27* (2023.02)

(58) Field of Classification Search
CPC .................................. H10B 43/27; H10B 43/20
See application file for complete search history.

(56) References Cited

U.S. PATENT DOCUMENTS

| 5,968,847 | A | 10/1999 | Ye et al. |
| 7,468,319 | B2 | 12/2008 | Lee |
| 9,748,268 | B1 | 8/2017 | Arai |

(Continued)

FOREIGN PATENT DOCUMENTS

| JP | 2002-507059 A | 3/2002 |
| JP | 2017-520913 A | 7/2017 |

(Continued)

OTHER PUBLICATIONS

International Search Report For Application No. PCT/US2020/065132, mailed Apr. 19, 2021, 3 pages.

(Continued)

*Primary Examiner* — Christopher A Johnson
(74) *Attorney, Agent, or Firm* — TraskBritt

(57) ABSTRACT

A microelectronic device comprising a stack structure comprising a non-staircase region, a staircase region, and an array region. Each of the non-staircase region, the staircase region, and the array region comprises tiers of alternating conductive materials and dielectric materials. One or more pillars are in the non-staircase region and in the array region, and one or more supports are in the staircase region. A conductive material is in each of the non-staircase region, the staircase region, and the array region and extends vertically into a source adjacent to the tiers. The source comprises corrosion containment features in each of the non-staircase region, the staircase region, and the array region, adjacent to the conductive material in the source. Additional microelectronic devices, electronic systems, and methods are also disclosed.

17 Claims, 13 Drawing Sheets

(56) References Cited

U.S. PATENT DOCUMENTS

| | | | |
|---|---|---|---|
| 11,257,834 B2* | 2/2022 | Luo | H10B 43/27 |
| 2013/0056816 A1 | 3/2013 | Iwase et al. | |
| 2014/0054673 A1 | 2/2014 | Kim et al. | |
| 2015/0348984 A1 | 12/2015 | Yada et al. | |
| 2016/0329343 A1 | 11/2016 | Pachamuthu et al. | |
| 2017/0011996 A1 | 1/2017 | Lee et al. | |
| 2017/0221756 A1 | 8/2017 | Tsutsumi et al. | |
| 2017/0309636 A1 | 10/2017 | Lee | |
| 2018/0261671 A1 | 9/2018 | Matsumoto et al. | |
| 2018/0308559 A1 | 10/2018 | Kim et al. | |
| 2019/0067314 A1 | 2/2019 | Lu et al. | |
| 2019/0326315 A1 | 10/2019 | Lee et al. | |
| 2020/0328226 A1 | 10/2020 | Park et al. | |
| 2021/0036010 A1* | 2/2021 | Sim | H10B 43/10 |
| 2021/0091063 A1* | 3/2021 | Ninomiya | H01L 24/03 |

FOREIGN PATENT DOCUMENTS

| | | |
|---|---|---|
| JP | 2019-114698 A | 7/2019 |
| JP | 2019-169510 A | 10/2019 |
| KR | 10-2006-0007541 A | 1/2006 |
| KR | 10-2006-0011575 A | 2/2006 |
| KR | 10-2018-0042358 A | 4/2018 |
| TW | 201826507 A | 7/2018 |
| WO | 2015/077971 A1 | 11/2015 |

OTHER PUBLICATIONS

Taiwanese Notice of Allowance for Application No. 109144624, dated Oct. 20, 2021, 5 pages.

Written Opinion of the International Searching Authority for Application No. PCT/US2020/065132, mailed Apr. 19, 2021, 4 pages.

Japanese Notice of Reasons for Refusal for Japanese Application No. 2022-543035, dated Sep. 20, 2023, 9 pages with English translation.

Japanese Second Notice of Reasons for Refusal for Japanese Application No. 2022-543035, dated Feb. 13, 2024, 8 pages with English translation.

Japanese Third Notice of Reasons for Refusal for Japanese Application No. 2022-543035, dated Jul. 23, 2024, 4 pages with English translation.

Korean Notice of Reasons for Rejection for Korean Application No. 10-2022-7027487, dated Aug. 21, 2024, 9 pages with English translation.

\* cited by examiner

MICROELECTRONIC DEVICES INCLUDING CORROSION CONTAINMENT FEATURES, AND RELATED ELECTRONIC SYSTEMS AND METHODS

CROSS-REFERENCE TO RELATED APPLICATION

This application is a continuation of U.S. patent application Ser. No. 16/743,342, filed Jan. 15, 2020, now U.S. Pat. No. 11,257,834, issued Feb. 22, 2022, the disclosure of which is hereby incorporated herein in its entirety by this reference.

TECHNICAL FIELD

The disclosure, in various embodiments, relates generally to the field of microelectronic device design and fabrication. More specifically, the disclosure relates to microelectronic device structures including features to contain corrosion, and to related microelectronic devices, electronic systems, and methods.

BACKGROUND

A continuing goal of the microelectronics industry has been to increase the memory density (e.g., the number of memory cells per memory die) of memory devices, such as non-volatile memory devices (e.g., NAND Flash memory devices). One way of increasing memory density in non-volatile memory devices is to utilize vertical memory array (also referred to as a "three-dimensional (3D) memory array") architectures. A conventional vertical memory array includes transistor/memory-cell pillars extending through one or more decks (e.g., stack structures) including tiers of alternating conductive materials and dielectric materials. The vertically oriented conductive materials of the tiers are configured, for example, as word lines or control gates and the dielectric materials are at each junction of the memory-cell pillars and the conductive materials. This configuration permits a greater number of transistors to be located in a unit of die area by building the array upwards (e.g., longitudinally, vertically) on a die, as compared to structures with conventional planar (e.g., two-dimensional) arrangements of transistors. Such a configuration permits a greater number of switching devices (e.g., transistors) to be located in a unit of die area (i.e., length and width of active surface consumed) by building the array upwards (e.g., vertically) on a die, as compared to structures with conventional planar (e.g., two-dimensional) arrangements of transistors.

To form 3D NAND Flash memory devices, a so-called "replacement gate" process may be used, in which tiers including alternating dielectric materials and nitride materials become tiers including alternating dielectric materials and conductive materials. The nitride material of the tiers is replaced with a conductive material, producing the tiers of alternating conductive materials and dielectric materials. During the replacement gate process, a material removal process (e.g., an etch process) is conducted to form so-called "slits" in the tiers, with the slits extending from an upper surface of an uppermost tier to a lower surface of a lowermost tier. The nitride material of the tiers is then removed through the slits and replaced with the conductive material. The slits may be present in different portions of the 3D NAND Flash memory device, such as in a staircase region, an array region, or a region external to the staircase region. During the formation of the slits, overetch of the tier materials may occur, extending the slits through a contact material and into a source material underlying the tiers in the array region and into the source material underlying the non-staircase region. Therefore, the slits extend into the source material in the array region and the non-staircase region. Similarly, in forming the slits in the staircase region, a fill material may be overetched such that the slits extend through the fill material and into the source material in the staircase region. When exposed to the conditions (e.g., etch chemistry, etch time) of the etch process, corrosion of the source material and the contact material may occur in the staircase region, array region, or non-staircase region. The corrosion may cause lifting of the tiers in the array region and of the staircase in the staircase region, leading to arcing and other performance issues in the 3D NAND Flash memory device containing the corrosion.

DETAILED DESCRIPTION

Figure 1A:
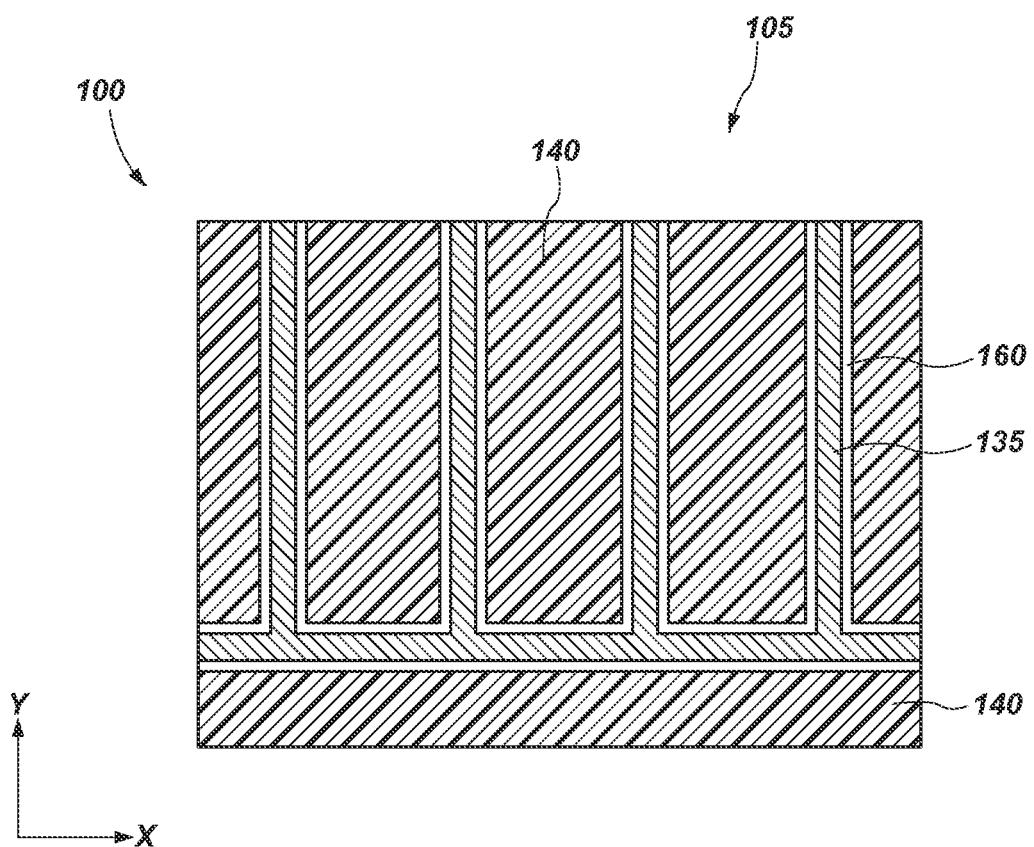
FIG. 1A is a simplified, partial top-down view of a non-staircase region of a microelectronic device structure in accordance with embodiments of the disclosure and at an initial stage of processing the microelectronic device structure.

Features (e.g., corrosion containment features) for reducing or substantially eliminating the effects of corrosion in a microelectronic device are disclosed. The microelectronic device includes a microelectronic device structure containing one or more materials (e.g., a source material, a contact material) susceptible to corrosion (e.g., oxidation) during a material removal act conducted during the formation of the microelectronic device. The corrosion containment features and the materials susceptible to corrosion are present in one or more regions of the microelectronic device structure, including in a staircase region, in an array region, or proximal (e.g., external) to the staircase region (e.g., a non-staircase region). The corrosion containment features reduce or substantially eliminate the effects of corrosion in the microelectronic device. By forming the corrosion containment features within a source of the microelectronic device structure, corrosion of the materials susceptible to corrosion is contained to a small area of the microelectronic device structure and the effects of the corrosion do not impact other areas of the microelectronic device structure. The corrosion containment features isolate (e.g., electrically isolate) the area affected by the corrosion from other areas of the microelectronic device structure. A bridge of a material of the source couples (e.g., connects) adjacent portions of the source in the array region of the microelectronic device structure. Methods of forming the microelectronic device structure including the corrosion containment features and the bridges are also disclosed, as are microelectronic devices and electronic systems including the corrosion containment features and the bridges.

The following description provides specific details, such as material compositions, shapes, and sizes, in order to provide a thorough description of embodiments of the disclosure. However, a person of ordinary skill in the art would understand that the embodiments of the disclosure may be practiced without employing these specific details. Indeed, the embodiments of the disclosure may be practiced in conjunction with conventional microelectronic device fabrication techniques employed in the industry. In addition, the description provided below does not form a complete process flow for manufacturing a microelectronic device (e.g., a memory device, such as a 3D NAND Flash memory device). The structures described below do not form a complete microelectronic device. Only those process acts and structures necessary to understand the embodiments of the disclosure are described in detail below. Additional acts to form a complete microelectronic device from the structures may be performed by conventional fabrication techniques.

Drawings presented herein are for illustrative purposes only, and are not meant to be actual views of any particular material, component, structure, device, or system. Variations from the shapes depicted in the drawings as a result, for example, of manufacturing techniques and/or tolerances, are to be expected. Thus, embodiments described herein are not to be construed as being limited to the particular shapes or regions as illustrated, but include deviations in shapes that result, for example, from manufacturing. For example, a region illustrated or described as box-shaped may have rough and/or nonlinear features, and a region illustrated or described as round may include some rough and/or linear features. Moreover, sharp angles that are illustrated may be rounded, and vice versa. Thus, the regions illustrated in the figures are schematic in nature, and their shapes are not intended to illustrate the precise shape of a region and do not limit the scope of the present claims. The drawings are not necessarily to scale. Additionally, elements common between figures may retain the same numerical designation.

As used herein, a "memory device" means and includes a microelectronic device exhibiting, but not limited to, memory functionality.

As used herein, the terms "vertical," "longitudinal," "horizontal," and "lateral" are in reference to a major plane of a structure and are not necessarily defined by earth's gravitational field. A "horizontal" or "lateral" direction is a direction that is substantially parallel to the major plane of the structure, while a "vertical" or "longitudinal" direction is a direction that is substantially perpendicular to the major plane of the structure. The major plane of the structure is defined by a surface of the structure having a relatively large area compared to other surfaces of the structure.

As used herein, "vertically-neighboring" or "longitudinally-neighboring" features (e.g., regions, structures, devices) means and includes features located most vertically proximate (e.g., vertically closest) one another. In addition, as used herein, "horizontally-neighboring" or "laterally-neighboring" features (e.g., regions, structures, devices) means and includes features located most horizontally proximate (e.g., horizontally closest) one another.

As used herein, spatially relative terms, such as "beneath," "below," "lower," "bottom," "above," "upper," "top," "front," "rear," "left," "right," and the like, may be used for ease of description to describe one element's or feature's relationship to another element(s) or feature(s) as illustrated in the figures. Unless otherwise specified, the spatially relative terms are intended to encompass different orientations of the materials in addition to the orientation depicted in the figures. For example, if materials in the figures are inverted, elements described as "below" or "beneath" or "under" or "on bottom of" other elements or features would then be oriented "above" or "on top of" the other elements or features. Thus, the term "below" can encompass both an orientation of above and below, depending on the context in which the term is used, which will be evident to one of ordinary skill in the art. The materials may be otherwise oriented (e.g., rotated 90 degrees, inverted, flipped) and the spatially relative descriptors used herein interpreted accordingly.

As used herein, the singular forms "a," "an," and "the" are intended to include the plural forms as well, unless the context clearly indicates otherwise.

As used herein, "and/or" includes any and all combinations of one or more of the associated listed items.

As used herein, the term "configured" refers to a size, shape, material composition, orientation, and arrangement of one or more of at least one structure and at least one apparatus facilitating operation of one or more of the structure and the apparatus in a pre-determined way.

As used herein, the phrase "coupled to" refers to structures operatively connected with each other, such as electrically connected through a direct ohmic connection or through an indirect connection (e.g., by way of another structure).

As used herein, the term "substantially" in reference to a given parameter, property, or condition means and includes to a degree that one of ordinary skill in the art would understand that the given parameter, property, or condition is met with a degree of variance, such as within acceptable tolerances. By way of example, depending on the particular parameter, property, or condition that is substantially met, the parameter, property, or condition may be at least 90.0 percent met, at least 95.0 percent met, at least 99.0 percent met, at least 99.9 percent met, or even 100.0 percent met.

As used herein, "about" or "approximately" in reference to a numerical value for a particular parameter is inclusive of the numerical value and a degree of variance from the numerical value that one of ordinary skill in the art would understand is within acceptable tolerances for the particular parameter. For example, "about" or "approximately" in reference to a numerical value may include additional numerical values within a range of from 90.0 percent to 110.0 percent of the numerical value, such as within a range of from 95.0 percent to 105.0 percent of the numerical value, within a range of from 97.5 percent to 102.5 percent of the numerical value, within a range of from 99.0 percent to 101.0 percent of the numerical value, within a range of from 99.5 percent to 100.5 percent of the numerical value, or within a range of from 99.9 percent to 100.1 percent of the numerical value.

Figure 1B:
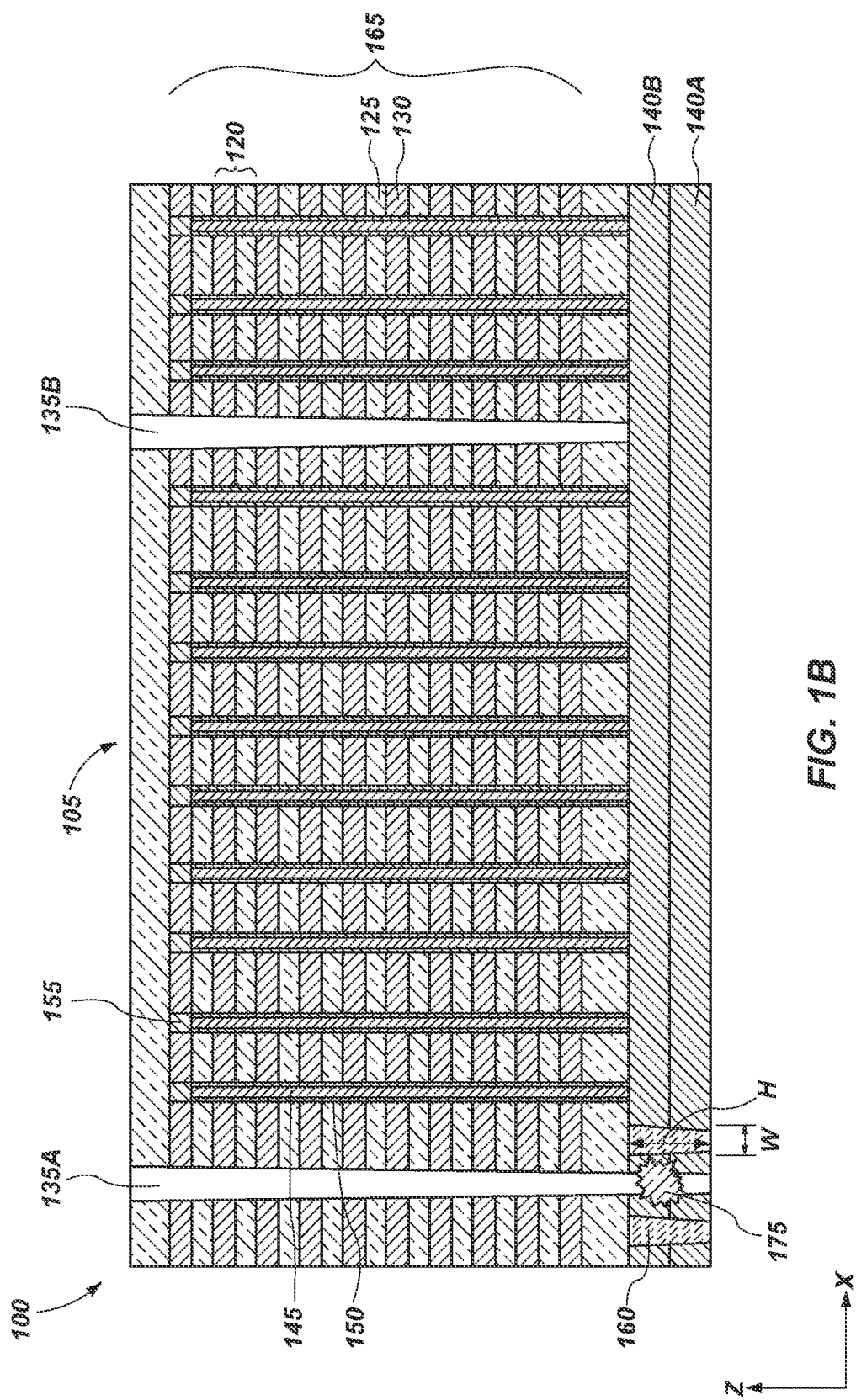
FIG. 1B is a simplified, partial cross-sectional view of the microelectronic device structure of FIG. 1A.

FIGS. 1A and 1B are a simplified, top down view and a simplified, partial cross-sectional view, respectively, of a non-staircase region 105 of a microelectronic device structure 100 of a microelectronic device (e.g., a semiconductor device, a memory device, such as a 3D NAND Flash memory device) at an initial processing stage of forming the microelectronic device. The non-staircase region 105 is external to an array region 110 (FIGS. 2A-2C) and a staircase region 115 (FIGS. 3A and 3B) of the microelectronic device structure 100 according to embodiments of the disclosure. The non-staircase region 105 may be positioned proximal to an edge of the staircase region 115 and distal to a staircase structure of the staircase region 115. The microelectronic device structure 100 may, for example, comprise a portion of a memory device (e.g., a multi-deck 3D NAND Flash memory device, such as a dual deck 3D NAND Flash memory device).

The non-staircase region 105 of the microelectronic device structure 100 includes tiers 120 of alternating dielectric material 125 and nitride material 130, slits 135, a source 140, pillars 145, cell material(s) 150, plug material 155, and corrosion containment features 160. The tiers 120 form a stack structure 165. One or more materials of the source 140 in the non-staircase region 105 may be susceptible to corrosion during replacement of the nitride material 130 with a conductive material 170 during a subsequent process act (e.g., a material removal act, a replacement gate process act), forming tiers 120' of vertically alternating dielectric material 125 and conductive material 170 (see FIG. 7). The source 140 is adjacent to (e.g., on, vertically adjacent to) a base material (not shown), and the tiers 120 of alternating dielectric material 125 and nitride material 130 are adjacent to (e.g., on, vertically adjacent to) the source 140. The source 140 and the tiers 120 extend in the x-direction. The slits 135 and the pillars 145 extend in the z-direction, with the cell material(s) 150 surrounding the pillars 145 and the plug material 155 adjacent to (e.g., on) the pillars 145. The tiers 120 and source 140 are oriented perpendicular to the slits 135 and the pillars 145.

The source 140 and the slits 135 are illustrated in combination in the top down view of FIG. 1A, with the slits 135 superimposed over the source 140. The corrosion containment features 160 are partially visible in the perspective of FIG. 1A. In the non-staircase region 105 illustrated in FIG. 1A, adjacent portions of the source 140 are isolated (e.g., electrically isolated) from one another by the slits 135. The slits 135 form a so-called "T-shape" in the x- and y-directions, and the adjacent portions of the source 140 are separated from one another by the slits 135. In the perspective of FIG. 1A, the slits 135 appear to be so-called "floating" in that the slits 135 do not appear to contact (e.g., connect to) the source 140. However, bridges 180 (FIG. 2A) of the source 140 connect adjacent portions of the source 140 to one another as discussed below.

The slits 135 (e.g., trenches, openings) vertically extend (e.g., in the Z-direction) through the tiers 120 and may extend into the source 140. The slits 135 may disrupt horizontal continuity of the dielectric material 125 and the nitride material 130 of the tiers 120. The slits 135 may be high aspect ratio openings, such as having an aspect ratio within a range of from about 10:1 to about 200:1. The aspect ratio of the slits 135 may depend on the number of tiers 120 in the microelectronic device structure 100. By way of example only, the microelectronic device structure 100 may have greater than or equal to ten tiers 120, greater than or equal to twenty-five tiers 120, greater than or equal to fifty tiers 120, greater than or equal to one hundred tiers 120, greater than or equal to one hundred and fifty tiers 120, or greater than or equal to two hundred tiers 120. A critical dimension (CD) (e.g., diameter) of an upper portion of the slits 135 may be greater than the CD of a lower portion of the slits 135. As illustrated in FIG. 1B, a first slit 135A extends through the tiers 120 and into the source 140 and a second slit 135B extends through the tiers 120 and to an upper surface of the source 140. The slits 135A extending into the source 140 may expose one or more materials of the source 140, which are susceptible to corrosion (e.g., oxidation) during subsequent processing acts. While FIG. 1B illustrates two slits 135 in the non-staircase region 105, more than two slits 135 may be present.

The source 140 includes one or more conductive materials formed on the base material. The conductive material is susceptible to corrosion (e.g., oxidation) during the replacement gate process act conducted during the formation of the microelectronic device structure 100. The conductive material may include, but is not limited to, polysilicon, tungsten silicide, cobalt silicide, nickel silicide, tungsten, other conductive material, a combination thereof, or other conductive material susceptible to corrosion. While FIG. 1B illustrates the source 140 as including two vertically adjacent materials 140A, 140B, a single material or more than two materials may be used as the source 140. While embodiments of the disclosure describe the source 140 as including polysilicon 140B over tungsten silicide 140A, the source 140 may include other conductive material(s) that are susceptible to corrosion when the replacement gate process act is conducted. In some embodiments, the source 140 includes the polysilicon 140B on the tungsten silicide 140A. A thickness of the source 140 may vary, depending on current and voltage requirements of the microelectronic device containing the microelectronic device structure 100.

The dielectric material 125 of the tiers 120 may be formed of and include at least one electrically insulative material, such as one or more of a dielectric oxide material (e.g., one or more of a silicon oxide ($SiO_x$), phosphosilicate glass, borosilicate glass, borophosphosilicate glass, fluorosilicate glass, an aluminum oxide ($AlO_x$), a hafnium oxide ($HfO_x$), a niobium oxide ($NbO_x$), a titanium oxide ($TiO_x$), a zirconium oxide ($ZrO_x$), a tantalum oxide ($TaO_x$), and a magnesium oxide ($MgO_x$)), at least one dielectric nitride material (e.g., a silicon nitride ($SiN_y$)), at least one dielectric oxynitride material (e.g., a silicon oxynitride ($SiO_xN_y$)), and at least one dielectric carboxynitride material (e.g., a silicon carboxynitride ($SiO_xC_zN_y$)). Formulae including one or more of "x," "y," and "z" herein (e.g., $SiO_x$, $AlO_x$, $HfO_x$, $NbO_x$, $TiO_x$, $SiN_y$, $SiO_xN_y$, $SiO_xC_zN_y$) represent a material that contains an average ratio of "x" atoms of one element, "y" atoms of another element, and "z" atoms of an additional element (if any) for every one atom of another element (e.g., Si, Al, Hf, Nb, Ti). As the formulae are representative of relative atomic ratios and not strict chemical structure, the dielectric material 125 may comprise one or more stoichiometric compounds and/or one or more non-stoichiometric compounds, and values of "x," "y," and "z" (if any) may be integers or may be non-integers. As used herein, the term "non-stoichiometric compound" means and includes a chemical compound with an elemental composition that cannot be represented by a ratio of well-defined natural numbers and is in violation of the law of definite proportions. In some embodiments, the dielectric material 125 is formed of and includes a silicon oxide (e.g., $SiO_2$). The dielectric material 125 of each of the tiers 120 of the stack structure 165 may each be substantially planar, and may each individually exhibit a desired thickness.

The nitride material 130 of the tiers 120 may be formed of and include a dielectric nitride material, such as $SiN_y$ (e.g., $Si_3N_4$). The nitride material 130 of the tiers 120 is selectively etchable relative to the dielectric material 125 of the tiers 120. As used herein, a material is "selectively etchable" relative to another material if the material exhibits an etch rate that is at least about five times greater than the etch rate of another material, such as about ten times greater, about twenty times greater, or about forty times greater. The nitride material 130 of each of the tiers 120 of the stack structure 165 may each be substantially planar, and may each individually exhibit a desired thickness. Materials other than the dielectric nitride material may be used as long as the selected dielectric material exhibits the desired etch selectivity relative to the dielectric material 125.

The pillars 145, cell material(s) 150, and plug material 155 may be formed of and include different materials. The pillars 145 extend through the tiers 120 of the non-staircase region 105 and to the upper surface of the source 140. The pillars 145 may provide one or more of mechanical support (e.g., structural support) or electrical coupling (e.g., electrical connection) in the microelectronic device structure 100 depending on the material used to form the pillars 145. In some embodiments, the pillars 145 are formed of a conductive material. In other embodiments, the pillars 145 are formed of a dielectric material. In yet other embodiments, the pillars 145 are formed of a channel material. The pillars 145 contact (e.g., physically contact, electrically connect) the upper surface of the source 140. The conductive material of the pillars 145 may include, but is not limited to, one or more of a metal (e.g., W, Ti, Mo, Nb, V, Hf, Ta, Cr, Zr, Fe, Ru, Os, Co, Rh, Jr, Ni, Pd, Pt, Cu, Ag, Au, Al), an alloy (e.g., a Co-based alloy, an Fe-based alloy, an Ni-based alloy, an Fe- and Ni-based alloy, a Co- and Ni-based alloy, an Fe- and Co-based alloy, a Co- and Ni- and Fe-based alloy, an Al-based alloy, a Cu-based alloy, a Mg-based alloy, a Ti-based alloy, a steel, a low-carbon steel, a stainless steel), a conductive metal-containing material (e.g., a conductive metal nitride, a conductive metal silicide, a conductive metal carbide, a conductive metal oxide), a conductively-doped semiconductor material (e.g., conductively-doped Si, conductively-doped Ge, conductively-doped SiGe).

The cell material(s) 150 are present on sidewalls of the pillars 145, between the pillars 145 and the tiers 120, and may be a dielectric material, a conductive material, etc. The cell material(s) 150 may include one or more of an oxide material, a storage material, a tunnel dielectric material, or a channel material as known in the art. The cell material(s) 150 substantially surround (e.g., substantially horizontally and vertically cover) the sidewalls of each of the pillars 145. The plug material 155 is present at an upper portion of the pillars 145 (e.g., over the pillars 145) and may be formed of a conductive material. The plug material 155 may be electrically connected to other conductive materials of the microelectronic device structure 100.

The corrosion containment features 160 are present in (e.g., within) the source 140 and are adjacent to one or more of the slits 135A in the non-staircase region 105 of the microelectronic device structure 100. As shown in FIG. 1B, the corrosion containment features 160 are adjacent to (e.g., laterally adjacent to) the slit 135A that extends into the source 140 but are not adjacent to the slit 135B, which does not extend into the source 140. The corrosion containment features 160 may substantially surround the lower portion of the slit 135A (e.g., the portion of the slit 135A within the source 140) and exhibit a height H that substantially corresponds to the thickness of the source 140. Upper surfaces and lower surfaces of the corrosion containment features 160 may, therefore, be substantially coplanar with upper surfaces and lower surfaces of the source 140. The corrosion containment features 160 are located adjacent to (e.g., laterally adjacent to) portions of the slits 135A where corrosion occurs, such as at the lower portions of the slits 135A. The corrosion containment features 160 may extend from the upper surface of the source 140 to a lower surface of the source 140. Without being bound by any theory, it is believed that the corrosion containment features 160 restrict (e.g., contain) corrosion 175 of material(s) in the source 140 to a smaller area than would occur if the corrosion containment features 160 were not present. The corrosion containment features 160 are formed of a dielectric material, such as a dielectric oxide material, that is not substantially removed during the replacement gate process act used to remove the nitride material 130 of the tiers 120. In other words, the nitride material 130 of the tiers 120 is selectively etchable relative to the material of the corrosion containment features 160 and to the dielectric material 125 of the tiers 120. In some embodiments, the corrosion containment features 160 are formed of a silicon oxide, such as silicon dioxide. However, other selectively etchable dielectric materials may also be used.

Dimensions of the corrosion containment features 160 may be selected based on the electrical field and voltage requirements of the microelectronic device containing the microelectronic device structure 100. The height H of the corrosion containment features 160 may correspond to the thickness of the source 140 and a width W of the corrosion containment features 160 may be from about 20 nm to about 100 nm. By way of example only, a desired breakdown voltage of the microelectronic device may affect the dimensions of the corrosion containment features 160. Each of the corrosion containment features 160 in one or more of the non-staircase region 105, the staircase region 115, and the array region 110 may exhibit the same size or a different size.

Figure 2A:
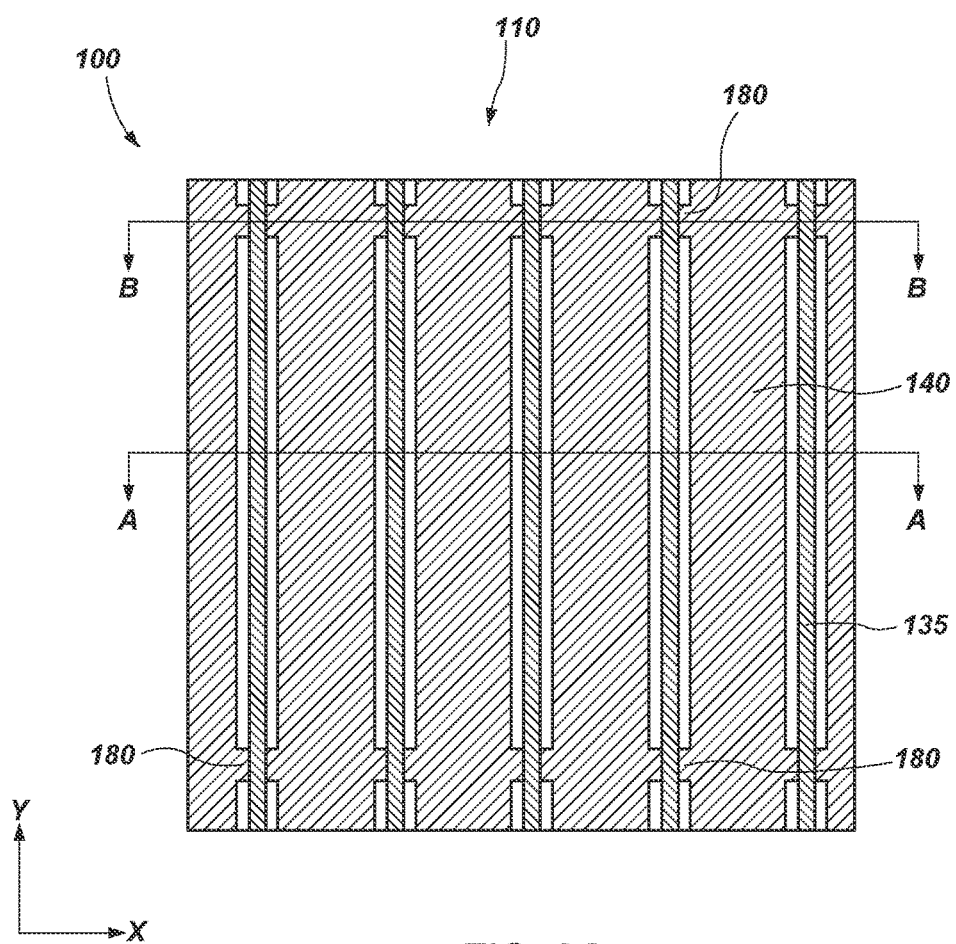
FIG. 2A is a simplified, partial top-down view of an array region of a microelectronic device structure in accordance with embodiments of the disclosure and at the initial stage of processing the microelectronic device structure.
Figure 2B:
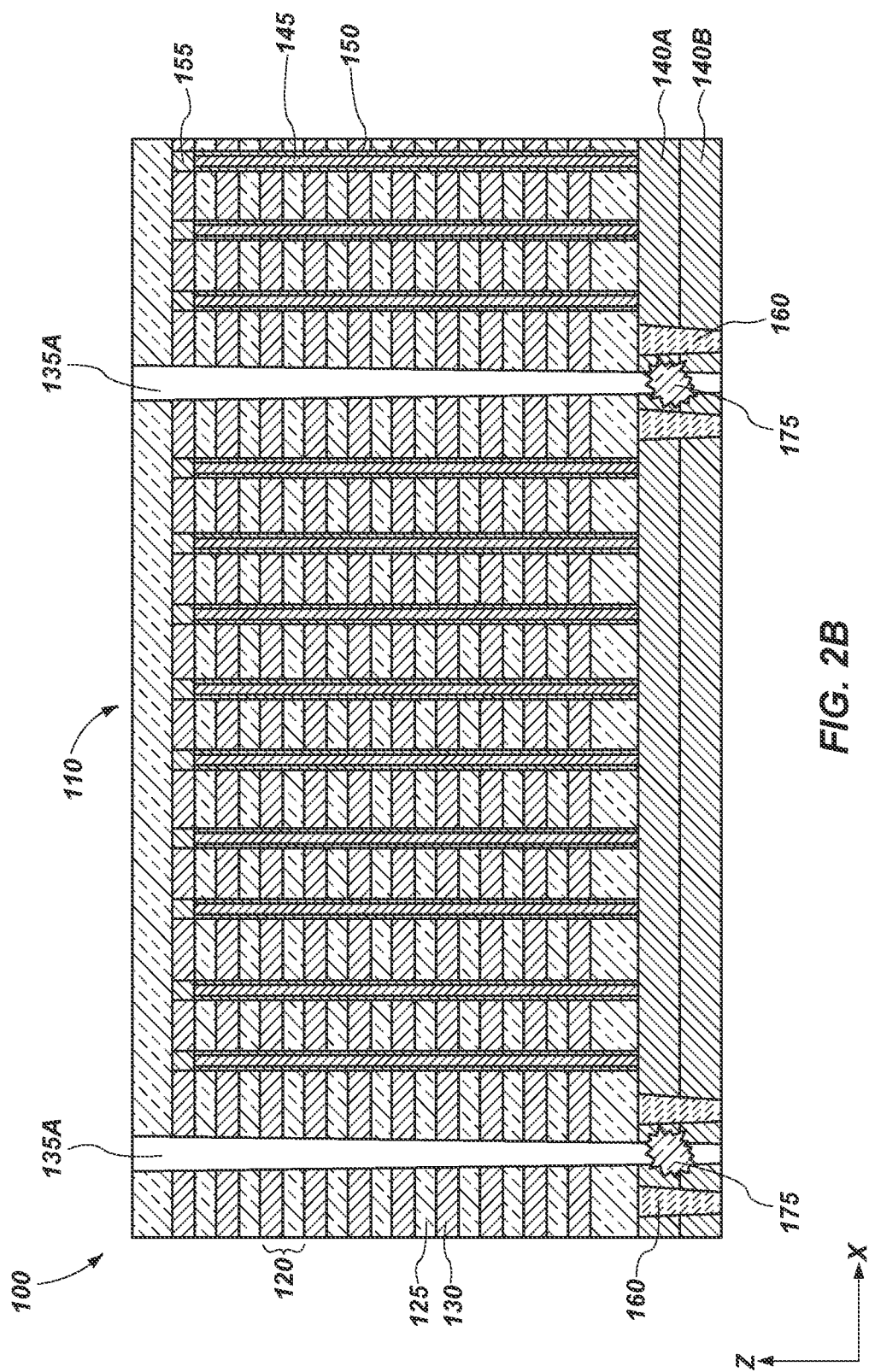
FIG. 2B is a simplified, partial cross-sectional view along line A-A of the microelectronic device structure of FIG. 2A.
Figure 2C:
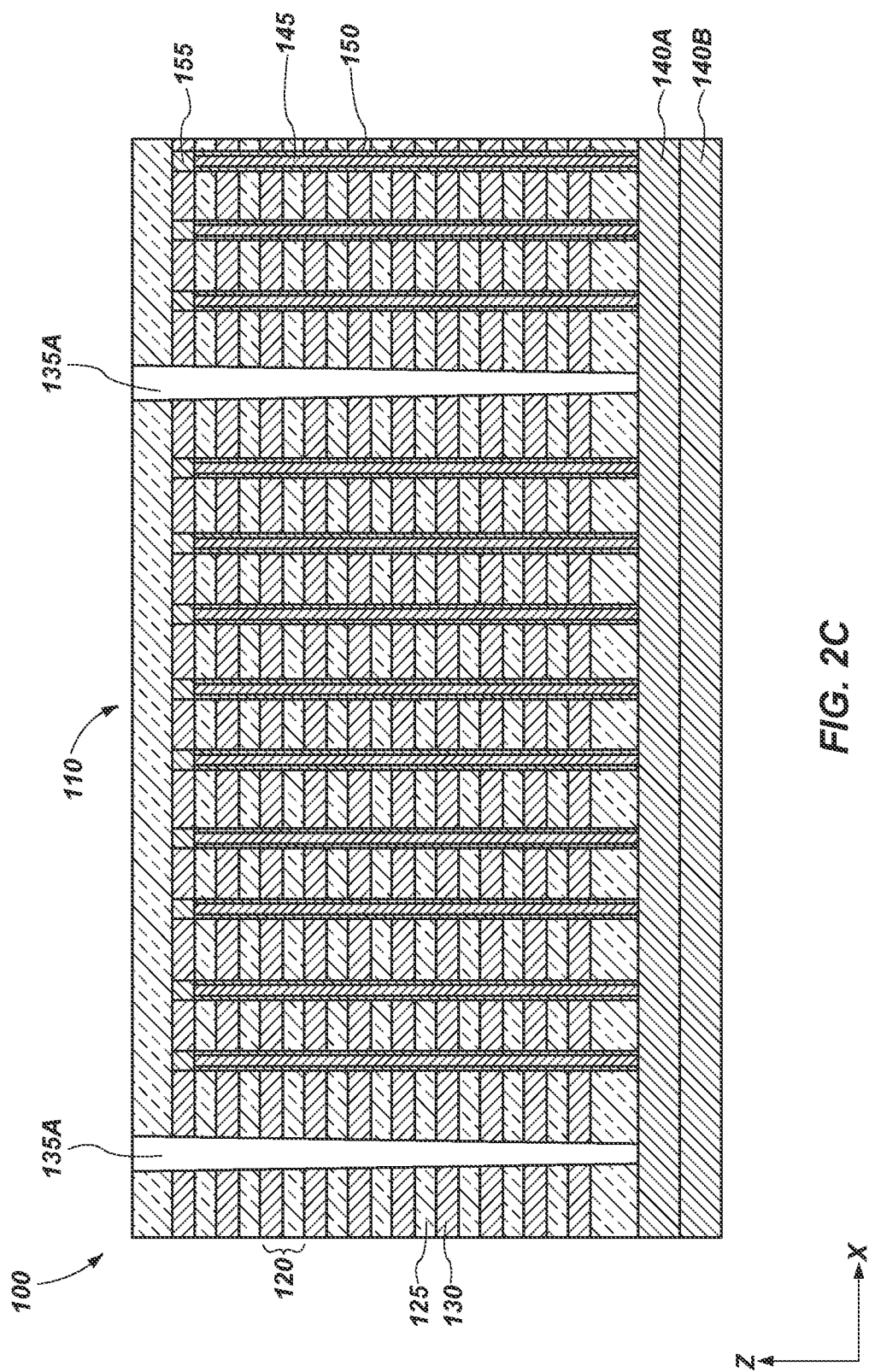
FIG. 2C is a simplified, partial cross-sectional view along line B-B of the microelectronic device structure of FIG. 2A.

FIG. 2A is a simplified, top down view of the array region 110 of the microelectronic device structure 100 at the initial processing stage and includes the slits 135 superimposed over the source 140. FIGS. 2B and 2C are simplified, partial cross-sectional views of the array region 110 at the initial processing stage along the A-A and B-B lines, respectively, of FIG. 2A. In the array region 110, the tiers 120 of alternating dielectric material 125 and nitride material 130, the slits 135, the source 140, the pillars 145, the cell material(s) 150, the plug material 155, and the corrosion containment features 160 are as discussed above with reference to FIGS. 1A and 1B. The array region 110 of the microelectronic device structure 100 differs from the non-staircase region 105 and the staircase region 115 in that so-called "bridges" 180 of the source 140 connect adjacent portions of the source 140 to one another, as shown in the perspective of FIG. 2A. While adjacent portions of the source 140 are isolated from one another in the non-staircase region 105 (FIG. 1A) of the microelectronic device structure 100 by the corrosion containment features 160, the portions of the source 140 in the array region 110 are connected to (e.g., electrically connected to) one another by the bridges 180. The bridges 180 enable a voltage to be applied to the source 140 in the array region 110. No voltage is applied to the non-staircase region 105 and the staircase region 115 so the portions of the source 140 in these regions of the microelectronic device may be isolated from one another, such as by the corrosion containment features 160. Without the bridges 180 in the array region 110, the portions of the source 140 would be substantially isolated from one another and from other components of the microelectronic device. While the corrosion containment features 160 in the source 140 isolate some portions of the source 140 from one another, other portions of the source 140 are connected to one another by the bridges 180 in the array region 110. The bridges 180, therefore, function to bypass the portions of the source 140 that are isolated by the corrosion containment features 160. Desired spacing between adjacent bridges 180 may be determined by the resistance of the source 140 and string current requirements of the microelectronic device.

As shown in FIG. 2B, the corrosion containment features 160 are present in the array region 110 of the microelectronic device structure 100, adjacent to two slits 135A that extend into the source 140. The corrosion containment features 160 substantially surround the lower portion of the slits 135A (e.g., the portions of the slits 135A in the source 140) and exhibit the height H. While two slits 135A are shown in FIG. 2B, additional slits 135A may be present, with the corrosion containment features 160 adjacent to (e.g., surrounding) the slits 135A. While FIG. 2B illustrates the slits 135A as extending into the source 140 by the same amount, one or more of the slits 135A may extend a different distance into the source 140. While not illustrated in FIG. 2B for simplicity, the array region 110 also includes contact structures (not shown) at the lower portions of the pillars 145 and proximal to the source 140, providing electrical coupling (e.g., electrical connection) to the source 140.

As shown in the perspective of FIG. 2C, the source 140 does not include the corrosion containment features 160 when viewed along the B-B line of FIG. 2A. Rather, the source 140 is substantially continuous and is not separated into segments by the corrosion containment features 160.

Figure 3A:
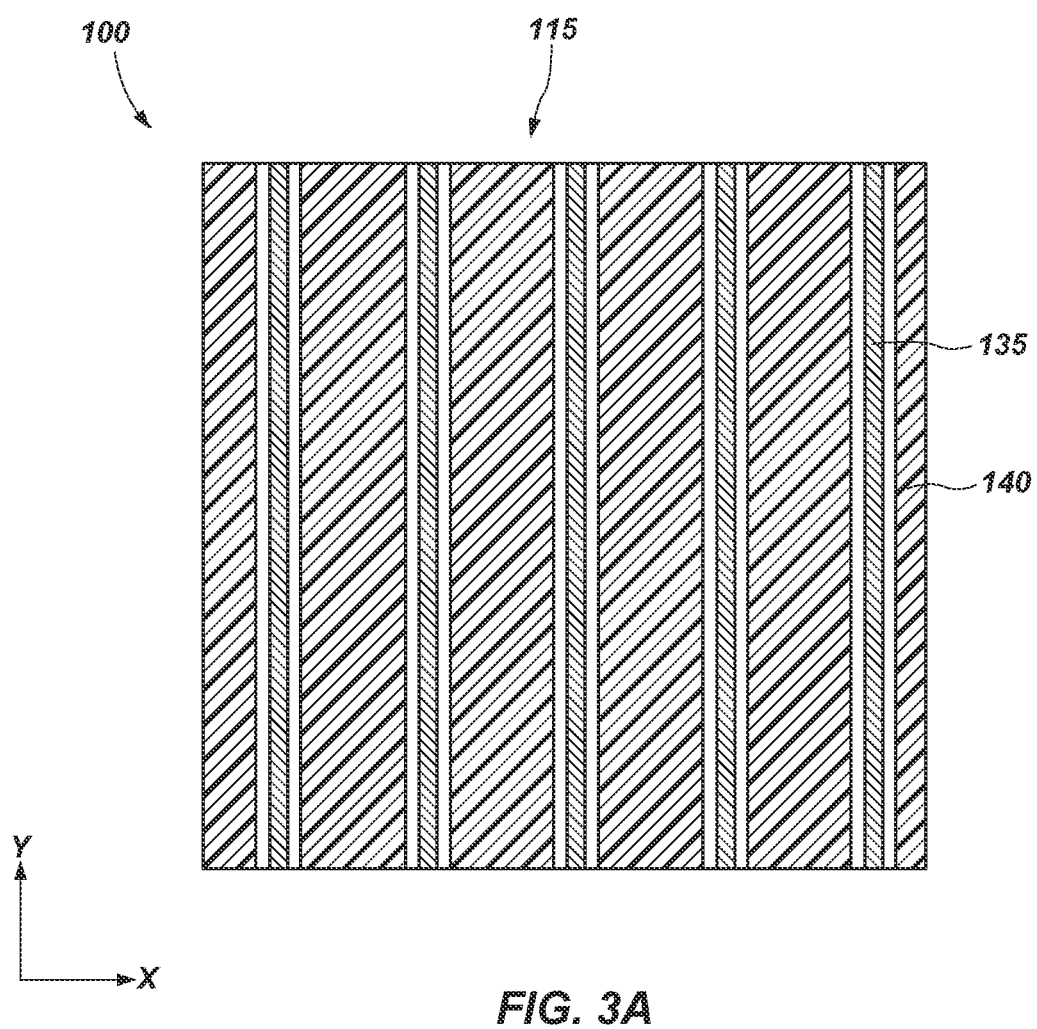
FIG. 3A is a simplified, partial top-down view of a staircase region of a microelectronic device structure in accordance with embodiments of the disclosure and at the initial stage of processing the microelectronic device structure.
Figure 3B:
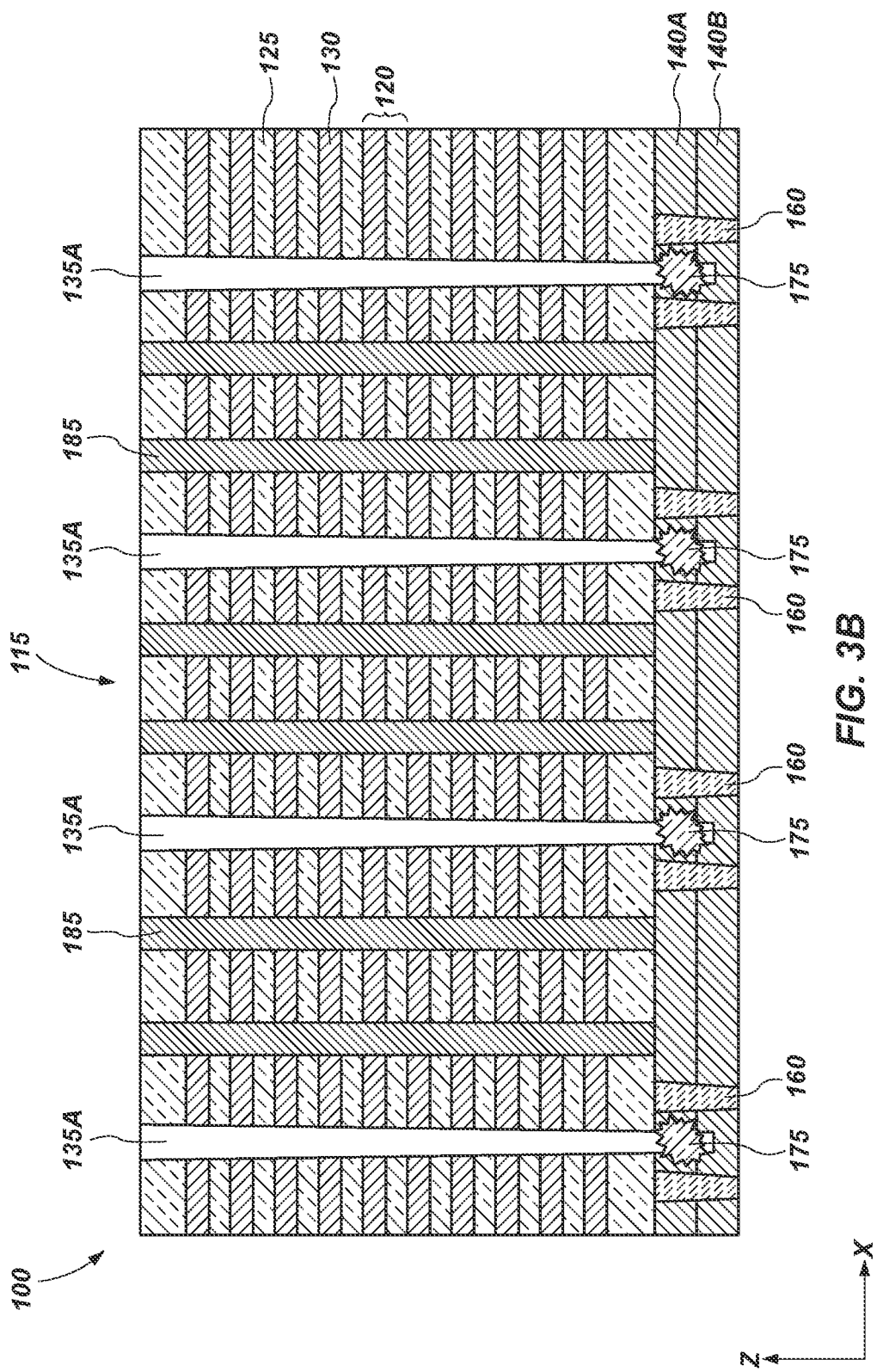
FIG. 3B is a simplified, partial cross-sectional view of the microelectronic device structure of FIG. 3A.

FIGS. 3A and 3B are a simplified, top down view and a simplified, partial cross-sectional view, respectively, of the staircase region 115 of the microelectronic device structure 100 at the initial processing stage. In the staircase region 115, the tiers 120 of alternating dielectric material 125 and nitride material 130, the slits 135, the source 140, and the corrosion containment features 160 are as discussed above with reference to FIGS. 1A and 1B. The staircase region 115 also includes supports 185, which may provide one or more of mechanical support or electrical connection to the staircase structure (not shown) in the staircase region 115 of the microelectronic device structure 100. The staircase structure may be positioned in a central portion of the staircase region 115 and not proximal to the illustrated edge of the staircase region 115. The supports 185 may be in physical contact or in electrical contact with the source 140. The staircase region 115 includes steps (e.g., contact regions) (not shown in the perspective of FIGS. 3A and 3B) defined by edges of the tiers 120. Contacts (not shown) may physically and electrically contact the steps in the staircase region 115 to provide electrical access to the source 140 of the microelectronic device structure 100.

The staircase region 115 of the microelectronic device structure 100 differs from the non-staircase region 105 in that the slits 135 of the staircase region 115 do not form a T-shape, as shown in FIG. 3A, which includes the slits 135 superimposed over the source 140. Instead, the slits 135 of the staircase region 115 run substantially parallel to one another. The staircase region 115 of the microelectronic device structure 100 also differs from the array region 110 in that no bridges 180 are present to connect adjacent portions of the source 140. As discussed above, the bridges 180 of the source 140 are only present in the array region 110.

As shown in FIG. 3B, the corrosion containment features 160 are present in the staircase region 115 of the microelectronic device structure 100, adjacent to four slits 135A that extend into the source 140. The corrosion containment features 160 substantially surround the lower portion of the slits 135A and exhibit the height H. While the four slits 135A are shown in FIG. 3B, a lesser number of slits 135A or a greater number of slits 135A may be present, with the corrosion containment features 160 adjacent to the slits 135A. While FIG. 3B illustrates the slits 135A as extending into the source 140 by the same amount, one or more of the slits 135A may extend a different distance into the source 140.

Figure 4:
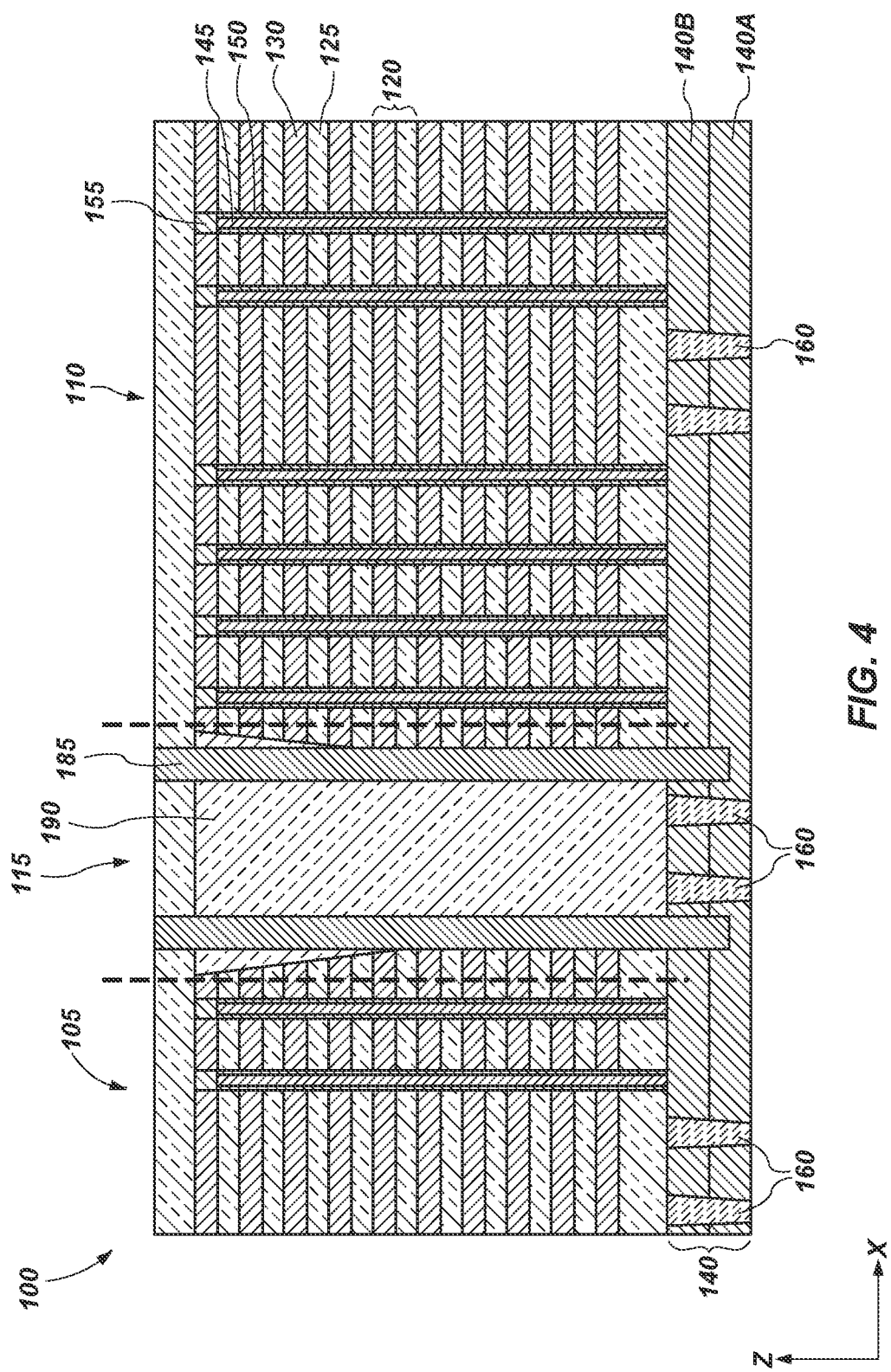
FIGS. 4-7 illustrate a process of forming the microelectronic device structure in accordance with embodiments of the disclosure.

To form the microelectronic device structure 100 shown in FIGS. 1A-3B, the source 140 is formed adjacent to (e.g., on) the base material (not shown) and patterned to form openings (not shown) in locations where the corrosion containment features 160 are ultimately to be formed. The openings extend at least partially into the source 140. The source 140 may include the one or more conductive materials formed adjacent to (e.g., on) the base material. The source 140 is formed and patterned by conventional techniques. A dielectric material (e.g., an oxide material) of the corrosion containment features 160 may be formed in the openings by conventional techniques, as shown in FIG. 4. The upper surfaces and lower surfaces of the corrosion containment features 160 are substantially coplanar with upper surfaces and lower surfaces of the source 140. The corrosion containment features 160 are formed in locations of the source 140 proximal to locations of the slits 135 (e.g., 135A) ultimately to be formed.

The alternating dielectric materials 125 and nitride materials 130 are then formed adjacent to (e.g., on) the source 140 by conventional techniques and patterned to form additional openings (not shown) in which the pillars 145, cell material(s) 150, and plug material 155 are formed in the non-staircase region 105 and the array region 110 and in which the supports 185 are formed in the staircase region 115. The staircase region 115 may also include a fill material 190 between adjacent supports 185. For simplicity, FIG. 4 includes the non-staircase region 105, the staircase region 115, and the array region 110 combined in a single drawing, with the individual regions separated by vertical dashed lines. The patterning of the tiers 120, formation of the fill material 190, and formation of the pillars 145, cell material (s) 150, plug material 155, and supports 185 may be conducted by conventional processes (e.g., conventional material deposition processes, conventional photolithography processes, conventional material removal processes) and conventional processing equipment, which are not described in detail herein.

Figure 5:
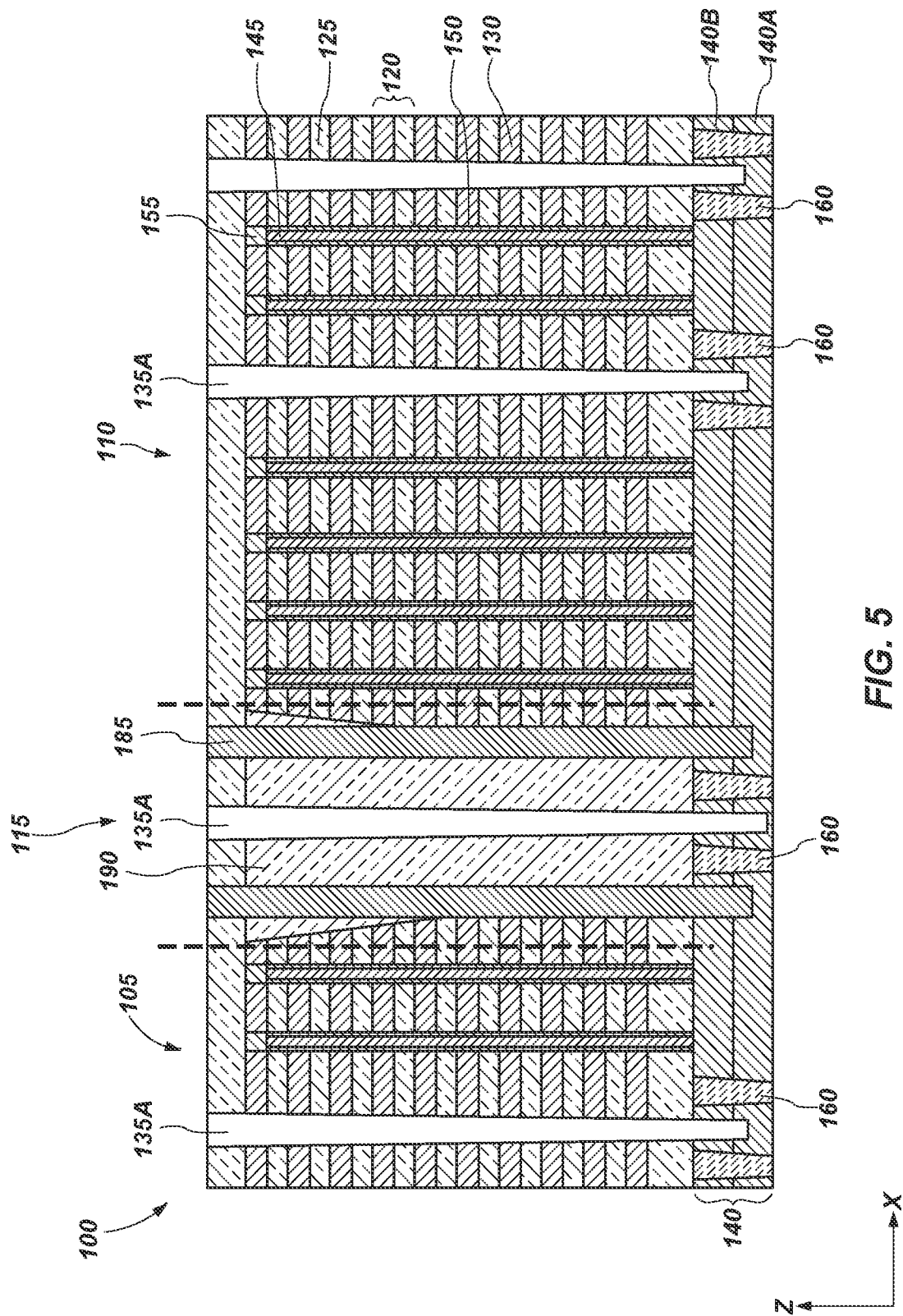

As shown in FIG. 5, the slits 135 (e.g., 135A, 135B) are formed in the staircase region 115, the array region 110, and the non-staircase region 105 by exposing the tiers 120 and the fill material 190 to a material removal process (e.g., an etch process) that removes portions of the alternating dielectric materials 125 and nitride materials 130 in the non-staircase region 105 and the array region 110 and portions of the fill material 190 in the staircase region 115. A conventional etch chemistry may be used to form the slits 135. The etch conditions (e.g., etch chemistry, etch time) of the material removal process may be selected to remove the desired portions of the tiers 120 and the fill material 190 without substantially removing other exposed materials. Some of the source 140, however, may be removed depending on the etch conditions used, extending one or more of the slits 135 into at least a portion of the source 140 and forming one or more slits 135A. As discussed above, the corrosion containment features 160 are located in the source 140 adjacent to the slits 135A. The material removal process may form the slits 135 extending from the uppermost tier 120 to the upper surface of the source 140, with optional overetch into the source 140 occurring and forming the slits 135A. The overetch into one or more materials of the source 140 may occur due to differences in etch selectivity between materials of the microelectronic device structure 100 that are exposed to the etch conditions.

Figure 6:
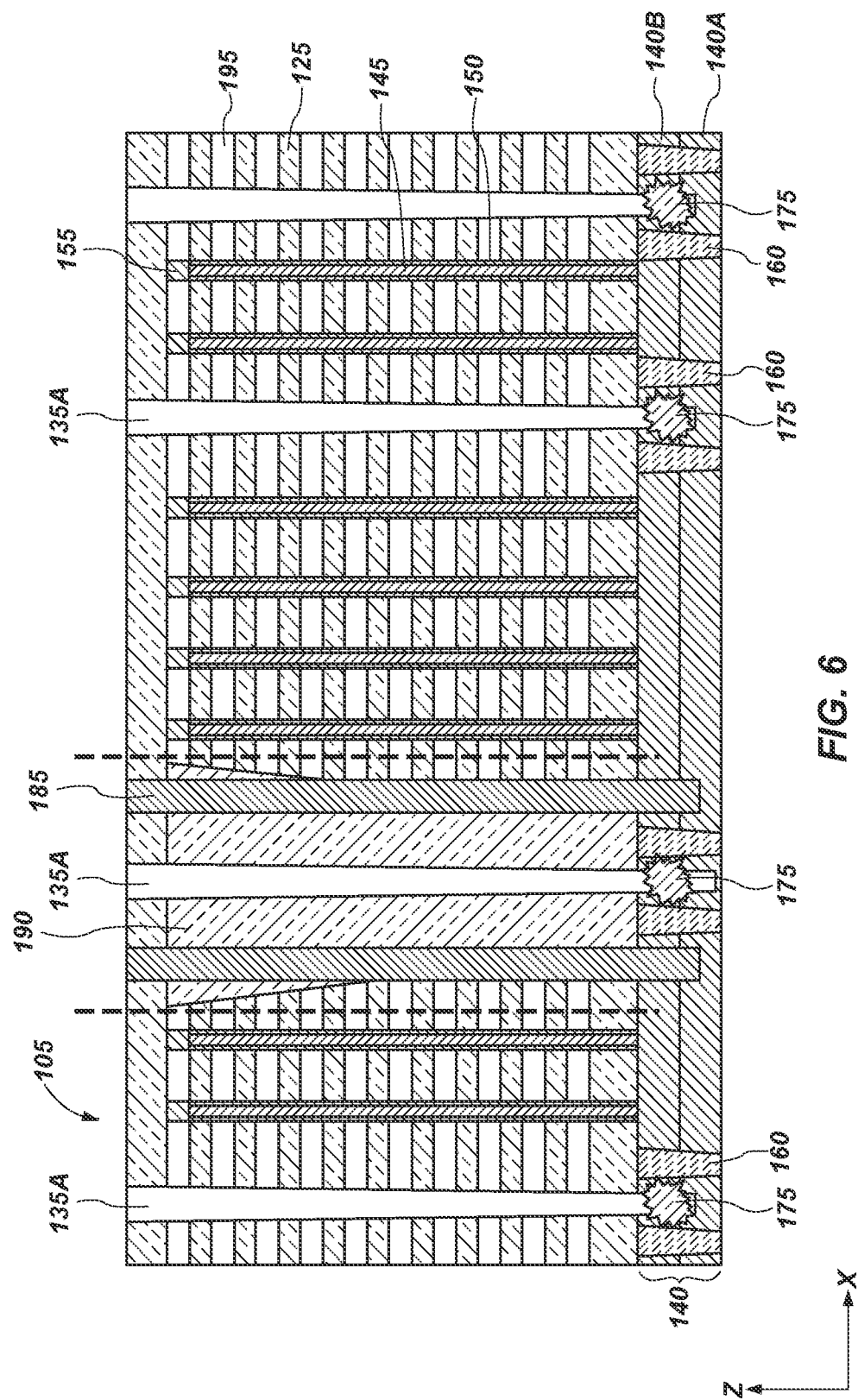
Figure 7:
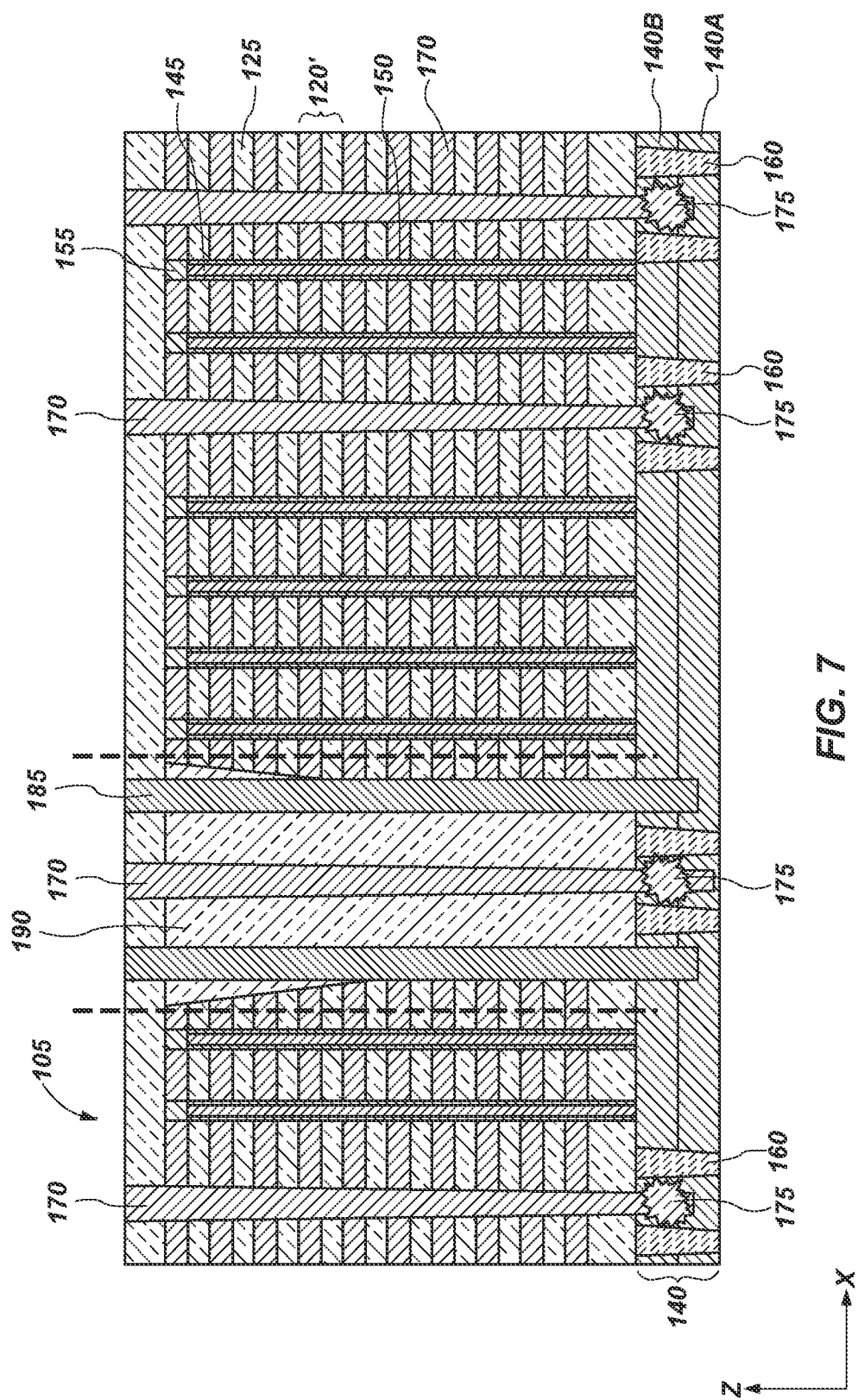

After forming the slits 135, 135A, the nitride material 130 of the tiers 120 may be removed, as shown in FIG. 6, forming voids 195, and replaced with a conductive material 170, as shown in FIG. 7, forming tiers 120' of vertically alternating dielectric material 125 and conductive material 170. The conductive material 170 of the tiers 120' of the stack structure 165 may be formed of and include at least one conductive material, such as a metal (e.g., tungsten (W), titanium (Ti), molybdenum (Mo), niobium (Nb), vanadium (V), hafnium (Hf), tantalum (Ta), chromium (Cr), zirconium (Zr), iron (Fe), ruthenium (Ru), osmium (Os), cobalt (Co), rhodium (Rh), iridium (Jr), nickel (Ni), palladium (Pd), platinum (Pt), copper (Cu), silver (Ag), gold (Au), aluminum (Al)), an alloy (e.g., a Co-based alloy, an Fe-based alloy, an Ni-based alloy, an Fe- and Ni-based alloy, a Co- and Ni-based alloy, an Fe- and Co-based alloy, a Co- and Ni- and Fe-based alloy, an Al-based alloy, a Cu-based alloy, a magnesium (Mg)-based alloy, a Ti-based alloy, a steel, a low-carbon steel, a stainless steel), a conductively-doped semiconductor material (e.g., conductively-doped polysilicon, conductively-doped germanium (Ge), conductively-doped silicon germanium (SiGe)), a conductive metal-containing material (e.g., a conductive metal nitride, a conductive metal silicide, a conductive metal carbide, a conductive metal oxide), or combinations thereof. In some embodiments, the conductive material 170 is formed of and includes tungsten. The slits 135, 135A may also contain the conductive material 170, which extends from the upper surface of the tiers 120' and to the upper surface of the source 140 or into the source 140. The conductive material 170 may ultimately be removed from the slits 135, 135A and replaced with a dielectric material.

The removal of the nitride material 130 and the formation of the conductive material 170 in the voids 195 between adjacent dielectric materials 125 may be conducted through the slits 135, 135A using the material removal process (e.g., the replacement gate process) selective for the nitride material 130. The replacement gate process act removes the nitride material 130, forming the voids 195, while other exposed materials, such as the dielectric material 125, pillars 145, cell material(s) 150, plug material 155, supports 185, or fill material 190, are substantially unaffected by the etch conditions of the replacement gate process act. During the replacement gate process act, the supports 185 may provide mechanical strength to the stack structure 165 in the staircase region 115, while the pillars 145 provide mechanical strength to the stack structure 165 in the non-staircase region 105 and the array region 110.

Depending on the materials used as the source 140 and the etch conditions (e.g., etch chemistry, etch time) used to remove the nitride material 130, the source 140 in one or more of the staircase region 115, the array region 110, or the non-staircase region 105 may be susceptible to corrosion 175. In some embodiments, the corrosion of the source 140 and the supports 185 may occur in the staircase region 115, the array region 110, and the non-staircase region 105. The extent of corrosion 175 within the source 140 may differ depending on the extent of overetch of the material(s) into the source 140. By way of example only, if the source 140 includes polysilicon 140B and tungsten silicide 140A, the replacement gate process act may include a wet etch process act in which the nitride material 130 is exposed to a phosphorus-based wet etch chemistry. The phosphorus-based wet etch chemistry may corrode (e.g., oxidize) such materials of the source 140, extending the slits 135 into one or more materials of the source 140A, 140B. With the corrosion containment features 160 adjacent to the lower portions of the slits 135A, any corrosion 175 that occurs during the replacement gate process act may be contained within (e.g., limited to) the small area of the source 140 defined by sidewalls of the corrosion containment features 160. Since the slits 135A are surrounded by the corrosion containment features 160, the corrosion 175 of material(s) of the source 140 does not propagate (e.g., spread) throughout the source 140. Any undesirable effects of the corrosion 175 during use and operation of the microelectronic device are, therefore, limited to the area of the source 140 defined by the corrosion containment features 160. Therefore, performance properties of the microelectronic device containing the microelectronic device structure 100 according to embodiments of the disclosure may be maintained. The conductive material 170 may then be formed in the slits 135, 135A and in locations previously occupied by the nitride material 130, forming the conductive material 170 of the tiers 120' in addition to filling the voids 195 with the conductive material 170. The conductive material 170 in the voids 195 may serve, for example, as an interconnect to electrically couple (e.g., electrically connect) the source 140 and additional components connected thereto (e.g., conductive interconnects, conductive routing structures) to other components (e.g., additional components vertically above the stack structure 165) of the microelectronic device including the microelectronic device structure 100.

Additional processing acts may then be conducted by conventional techniques to form the microelectronic device including the microelectronic device structure 100. By way of example only, conductive structures, such as access line structures (e.g., word line structures), select lines, and data lines (e.g., bit lines), may be formed over the stack structure 165 and electrically coupled to (e.g., electrically connected) to the source 140. One or more additional microelectronic device structures (not shown) similar to the microelectronic device structure 100 may then be formed over the microelectronic device structure 100 to form a multi-deck memory device, such as a dual deck 3D NAND Flash memory device.

The corrosion containment features 160 according to embodiments of the disclosure may be formed without adding time-consuming and expensive process acts and without affecting integrity of the microelectronic device. Since the corrosion containment features 160 are easily formed in the source 140 during formation of the microelectronic device structure 100, the microelectronic device structure 100 according to embodiments of the disclosure may be formed without extensive process changes. For example, a photoresist material (not shown) already utilized in the formation of the microelectronic device structure 100 may be used to pattern the source 140 to form the openings in which the corrosion containment features 160 are ultimately formed. Therefore, there is little additional cost to produce the microelectronic device structure 100 according to embodiments of the disclosure.

Furthermore, by reducing the effects (e.g., lifting, arcing) of corrosion 175 on the microelectronic device including the microelectronic device structure 100, the yield of microelectronic devices formed according to embodiments of the disclosure may be increased relative to the yield of conventional microelectronic devices in which no corrosion containment features 160 are present. For instance, by reducing the extent of lifting of the tiers 120', arcing in the microelectronic devices including the microelectronic device structure 100 according to embodiments of the disclosure may be reduced. The reduced lifting of the tiers 120' also decreases any cross-contamination in the etch chemistry used for the replacement gate process act with subsequently-conducted processes.

Accordingly, embodiments of a microelectronic device are disclosed and comprise a stack structure comprising a non-staircase region, a staircase region, and an array region. Each of the non-staircase region, the staircase region, and the array region comprising tiers of alternating conductive materials and dielectric materials. One or more pillars are in the non-staircase region and in the array region, and one or more supports are in the staircase region. A conductive material is in each of the non-staircase region, the staircase region, and the array region and extends vertically into a source adjacent to the tiers. The source comprises corrosion containment features in each of the non-staircase region, the staircase region, and the array region, adjacent to the conductive material in the source.

Accordingly, in other embodiments, a microelectronic device is disclosed and comprises a stack structure comprising a non-staircase region, a staircase region, and an array region. Each of the non-staircase region, the staircase region, and the array region comprise tiers of alternating conductive materials and dielectric materials. A source is adjacent to the stack structure and comprises portions separated by corrosion containment features within the source. The source comprises bridges between adjacent portions of the source in the array region. Another conductive material extends vertically from an upper surface of the tiers and into the source.

Accordingly, embodiments of a method of forming a microelectronic device are disclosed. The method comprises forming a source comprising corrosion containment features therein. Tiers of alternating nitride materials and dielectric materials are formed adjacent to the source. One or more slits is formed and extends from an uppermost tier of the tiers and into the source. The corrosion containment features are adjacent to the one or more slits in the source. The nitride materials of the tiers are removed through the one or more slits to form voids between adjacent dielectric materials of the tiers. A conductive material is formed in the voids and in the slits.

Figure 8:
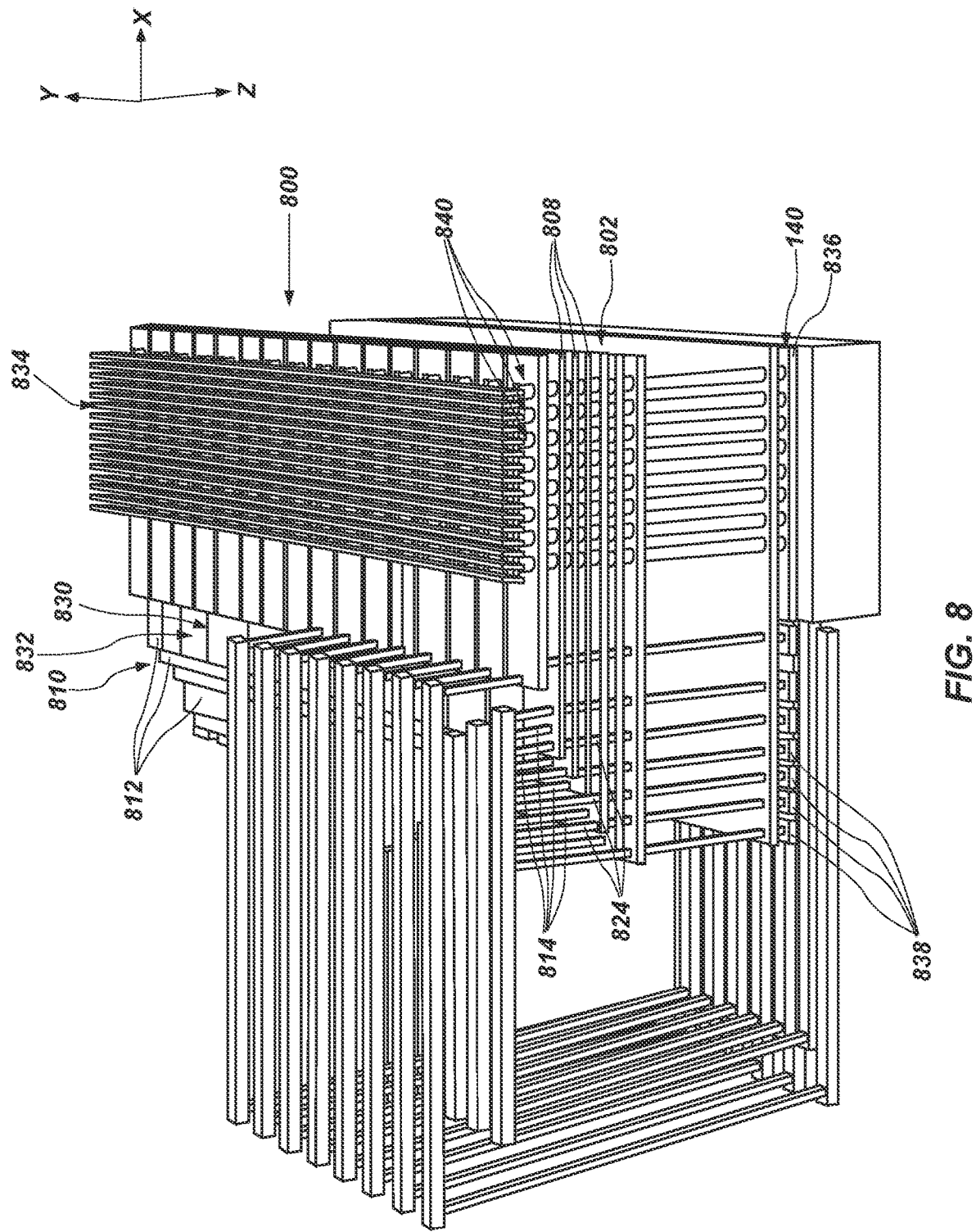
FIG. 8 is a partial cutaway perspective view of a microelectronic device including the microelectronic device structure in accordance with embodiments of the disclosure.

FIG. 8 illustrates a partial cutaway perspective view of a portion of a microelectronic device 800 (e.g., a memory device, such as a dual deck 3D NAND Flash memory device) including a microelectronic device structure 100 according to embodiments of the disclosure. The microelectronic device structure 100 may be substantially similar to the microelectronic device structure 100 previously described with reference to FIGS. 1-7. For example, as shown in FIG. 8, the microelectronic device structure 100 may include a stack structure 802 including tiers 808 of conductive materials 170 and dielectric materials 125, a staircase structure 810 having steps 812 defined by edges of the tiers 808, conductive contact structures 814 electrically connected to the steps 812 of the staircase structure 810, a source 140 vertically underlying the stack structure 802, and conductive pillar structures 824 vertically extending through the stack structure 802 to the source 140. The stack structure 802, the tiers 808, and the source 140 may respectively be substantially similar to the stack structure 165, the tiers 120, and the source 140 previously described with reference to FIGS. 1A-7. The staircase structure 802, the steps 812, and the conductive contact structures 814 may be formed by conventional techniques.

As shown in FIG. 8, the microelectronic device 800 may further include strings 830 of memory cells 832 vertically coupled to each other in series, data lines 834 (e.g., bit lines), access lines 836, and select lines 838. The strings 830 of the memory cells 832 extend vertically and orthogonal to conductive lines and tiers (e.g., the data lines 834, the source 140, the tiers 808 of the stack structure 802, the access lines 836, the select lines 838) of the microelectronic device 800, and the conductive contact structures 814 may electrically couple components to each other as shown (e.g., the access lines 836 and the select lines 838 to the tiers 808 of the stack structure 802 of the microelectronic device 800).

With continued reference to FIG. 8, the microelectronic device 800 may also include a control unit 840 (e.g., a control device) positioned vertically below the strings 830 of memory cells 832, which may include one or more of string driver circuitry, pass gates, circuitry for selecting gates, circuitry for selecting conductive lines (e.g., the data lines 834, the access lines 836, the select lines 838, additional data lines, additional access lines, additional select lines), circuitry for amplifying signals, and circuitry for sensing signals. In some embodiments, the control unit 840 is at least partially (e.g., substantially) positioned within horizontal boundaries (e.g., in the X-direction and the Y-direction) of a horizontal area occupied by the strings 830 of memory cells 832. The control unit 840 may, for example, be electrically coupled to the data lines 834, the source 140, the access lines 836, and select lines 838. In some embodiments, the control unit 840 includes CMOS (complementary metal-oxide-semiconductor) circuitry. In such embodiments, the control unit 840 may be characterized as having a "CMOS under Array" ("CuA") configuration.

Figure 9:
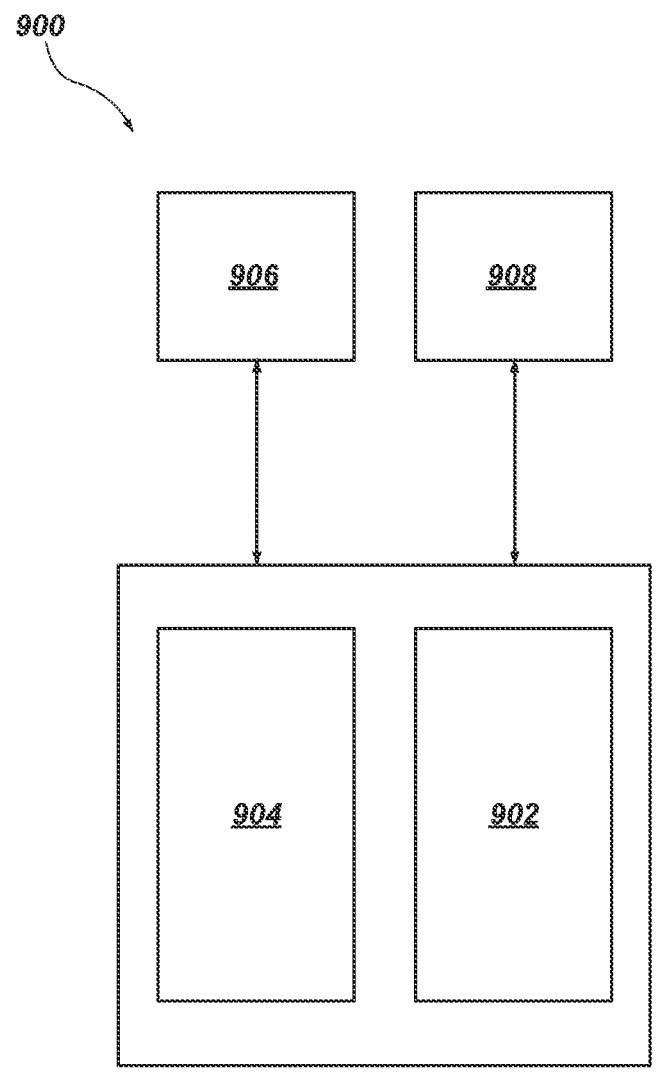
FIG. 9 is a schematic block diagram illustrating an electronic system including the microelectronic device structure in accordance with embodiments of the disclosure.

Microelectronic device structures (e.g., the microelectronic device structure 100 described with reference to FIGS. 1-7) and microelectronic devices (e.g., the microelectronic device 800 previously described with reference to FIG. 8) in accordance with embodiments of the disclosure may be used in electronic systems according to embodiments of the disclosure. FIG. 9 is a block diagram of an illustrative electronic system 900 according to embodiments of disclosure. The electronic system 900 may comprise, for example, a computer or computer hardware component, a server or other networking hardware component, a cellular telephone, a digital camera, a personal digital assistant (PDA), portable media (e.g., music) player, a Wi-Fi or cellular-enabled tablet such as, for example, an iPad® or SURFACE® tablet, an electronic book, a navigation device, etc. The electronic system 900 includes at least one memory device 902. The memory device 902 may comprise, for example, an embodiment of one or more of a microelectronic device structure (e.g., the microelectronic device structure 100 described with reference to FIGS. 1-7) and a microelectronic device (e.g., the microelectronic device 800 described with reference to FIG. 8) previously described herein. The electronic system 900 may further include at least one electronic signal processor device 904 (often referred to as a "microprocessor"). The electronic signal processor device 904 may, optionally, include an embodiment of one or more of a microelectronic device structure (e.g., the microelectronic device structure 100 described with reference to FIGS. 1-7) and a microelectronic device (e.g., the microelectronic device 800 described with reference to FIG. 8). While the memory device 902 and the electronic signal processor device 904 are depicted as two (2) separate devices in FIG. 9, in additional embodiments, a single (e.g., only one) memory/processor device having the functionalities of the memory device 902 and the electronic signal processor device 904 is included in the electronic system 900. In such embodiments, the memory/processor device may include one or more of a microelectronic device structure (e.g., the microelectronic device structure 100 described with reference to FIGS. 1-7) and a microelectronic device (e.g., the microelectronic device 800 described with reference to FIG. 8) previously described herein. The electronic system 900 may further include one or more input devices 906 for inputting information into the electronic system 900 by a user, such as, for example, a mouse or other pointing device, a keyboard, a touchpad, a button, or a control panel. The electronic system 900 may further include one or more output devices 908 for outputting information (e.g., visual or audio output) to a user such as, for example, a monitor, a display, a printer, an audio output jack, a speaker, etc. In some embodiments, the input device 906 and the output device 908 may comprise a single touchscreen device that can be used both to input information to the electronic system 900 and to output visual information to a user. The input device 906 and the output device 908 may communicate electrically with one or more of the memory device 902 and the electronic signal processor device 904.

Accordingly, embodiments of an electronic system are disclosed and comprise an input device, an output device, a processor device operably coupled to the input device and the output device, and a memory device operably coupled to the processor device. The memory device comprises at least one microelectronic device comprising a stack structure comprising tiers of alternating conductive materials and dielectric materials in a non-staircase region, a staircase region, and an array region. A source is adjacent to the stack structure and comprises portions separated by corrosion containment features. An upper surface of the source and of the corrosion containment features are substantially coplanar with one another. Another conductive material extends vertically from an upper surface of the tiers and into the source.

While the disclosure is susceptible to various modifications and alternative forms, specific embodiments have been shown by way of example in the drawings and have been described in detail herein. However, the disclosure is not limited to the particular forms disclosed. Rather, the disclosure is to cover all modifications, equivalents, and alternatives falling within the scope of the following appended claims and their legal equivalents.

What is claimed is:

1. A microelectronic device, comprising:
a stack structure comprising a non-staircase region, a staircase region, and an array region, the non-staircase region comprising corrosion containment features;
a source adjacent to the stack structure, the source comprising portions separated by the corrosion containment features and comprising bridges between adjacent portions of the source in the array region; and
a conductive material extending vertically into the source, a portion of the conductive material extending vertically above or beneath one or more of pillars, cell materials, and plug materials of the non-staircase region.

2. The microelectronic device of claim 1, wherein the conductive material in the non-staircase region exhibits a T-shape in cross-section.

3. A microelectronic device, comprising:
a stack structure comprising a non-staircase region, a staircase region, and an array region;
a source adjacent to the stack structure and comprising portions separated by corrosion containment features within the source, the source comprising bridges between adjacent portions of the source in the array region, the bridges electrically connecting portions of the source to one another; and
a conductive material extending vertically into the source and comprising an upper portion with a critical dimension that is greater than a critical dimension of a lower portion.

4. The microelectronic device of claim 3, wherein a width of the corrosion containment features is from about 20 nm to 100 nm.

5. The microelectronic device of claim 3, wherein the corrosion containment features are within one or more of the array region, the staircase region, and the non-staircase region.

6. The microelectronic device of claim 5, wherein the corrosion containment features are within at least two of the array region, the staircase region, and the non-staircase region.

7. The microelectronic device of claim 5, wherein the corrosion containment features are within at least two of the array region, the staircase region, and the non-staircase region, and one or more of the corrosion containment features of a respective region are different in size than one or more of the corrosion containment features of another respective region.

8. The microelectronic device of claim 3, wherein the corrosion containment features are continuous within the source in at least one direction.

9. The microelectronic device of claim 3, wherein the corrosion containment features of the array region are discontinuous in at least one direction.

10. The microelectronic device of claim 3, wherein the source comprises two or more conductive materials.

11. A microelectronic device, comprising:
a stack structure comprising a non-staircase region, a staircase region, and an array region;
a source comprising:
corrosion containment features within the source and vertically adjacent to the stack structure; and
bridges electrically connecting portions of the source in the array region to other portions of the source in the array region; and
a conductive material extending vertically through the stack structure and contacting the source, a portion of the conductive material within the non-staircase region exhibiting a T-shape in cross-section.

12. The microelectronic device of claim 11, wherein the corrosion containment features comprise a dielectric material substantially coplanar with upper and lower horizontal surfaces of the source.

13. The microelectronic device of claim 11, wherein a portion of the conductive material is directly adjacent and within portions of the source in the array region.

14. The microelectronic device of claim 11, wherein the corrosion containment features in the staircase region comprise a material that is substantially continuous within the source, in at least one direction.

15. The microelectronic device of claim 11, further comprising supports within the staircase region.

16. The microelectronic device of claim 15, wherein the supports comprise a first portion extending through the stack structure and a second portion extending at least partially into the source.

17. The microelectronic device of claim 16, wherein the second portion of the supports is within an area of the source material adjacent to the corrosion containment features.

* * * * *

UNITED STATES PATENT AND TRADEMARK OFFICE
CERTIFICATE OF CORRECTION

Page 1 of 1

PATENT NO.       : 12,127,400 B2
APPLICATION NO.  : 17/648708
DATED            : October 22, 2024
INVENTOR(S)      : Shuangqiang Luo and Indra V. Chary It is certified that error appears in the above-identified patent and that said Letters Patent is hereby corrected as shown below:

In the Specification

| | | |
|---|---|---|
| Column 6,  | Line 38, | change "silicon oxide (($SiO_x$)), phosphosilicate" to --silicon oxide ($SiO_x$), phosphosilicate-- |
| Column 7,  | Line 32, | change "Rh, Jr, Ni," to --Rh, Ir, Ni,-- |
| Column 11, | Line 22, | change "iridium (Jr)," to --iridium (Ir),-- |

Signed and Sealed this
Seventh Day of January, 2025

Derrick Brent
*Acting Director of the United States Patent and Trademark Office*